United States Patent [19]

Mourot

[11] Patent Number: 5,751,730
[45] Date of Patent: May 12, 1998

[54] ENCODING/INTERLEAVING METHOD AND CORRESPONDING DEINTERLEAVING/DECODING METHOD

[75] Inventor: Christophe Mourot, Asnieres, France

[73] Assignee: Alcatel N.V., Rijswijk, Netherlands

[21] Appl. No.: 716,151

[22] PCT Filed: Mar. 10, 1995

[86] PCT No.: PCT/FR95/00283

§ 371 Date: Sep. 12, 1996

§ 102(e) Date: Sep. 12, 1996

[87] PCT Pub. No.: WO95/25386

PCT Pub. Date: Sep. 21, 1995

[30] Foreign Application Priority Data

Mar. 15, 1994 [FR] France ............... 94 02988

[51] Int. Cl.$^6$ ............... H03M 13/22; H04L 1/20
[52] U.S. Cl. ............... 371/37.4; 371/37.06
[58] Field of Search ............... 371/37.4, 37.06

[56] References Cited

U.S. PATENT DOCUMENTS

| | | | |
|---|---|---|---|
| 4,653,051 | 3/1987 | Sugimura et al. | 371/37 |
| 4,665,537 | 5/1987 | Moriyama | 371/39 |
| 4,760,576 | 7/1988 | Sako | 371/40 |
| 4,845,714 | 7/1989 | Zook | 371/50 |
| 5,029,185 | 7/1991 | Wei | 375/27 |
| 5,170,400 | 12/1992 | Dotson | 371/37.4 |
| 5,517,484 | 5/1996 | Takagi et al. | 369/275.3 |

FOREIGN PATENT DOCUMENTS

| | | |
|---|---|---|
| 0204635A1 | 12/1986 | European Pat. Off. |
| 3539592A1 | 6/1987 | Germany. |
| 2048529A | 12/1980 | United Kingdom. |
| 2260245 | 4/1993 | United Kingdom. |

OTHER PUBLICATIONS

Shenton et al. "Improved Reed-Solomon Decoding Using Multiple-Pass Decoding". *Journal of the Audio/Acoustics/Applications*, vol. 33, No. 1/2, Jan./Feb. 1985, pp. 878–887.

*Primary Examiner*—Stephen M. Baker
*Attorney, Agent, or Firm*—Sughrue, Mion, Zinn, Macpeak & Seas, PLLC

[57] ABSTRACT

A method of encoding/interleaving a source sequence of data symbols to be transmitted to produce at least two bursts to be sent made up of said data symbols to be transmitted and redundancy symbols writes the data symbols to be transmitted into a base matrix. It stores the base matrix in a first quadrant of a send extended matrix. It carries out first and second encoding steps using the columns and rows, respectively, of the base matrix, generating first and second redundancy symbols which are stored in second and third quadrants of the send extended matrix and constitute additional rows of the base matrix. It reads the send extended matrix row by row (or column by column), each row (or column) of the send extended matrix constituting a burst to be sent.

12 Claims, 8 Drawing Sheets

Fig. 1

| $x_1$ | $x_2$ | $x_3$ | $\cdots$ | $x_k$ | $t_{1,1}$ | $t_{1,2}$ | $\cdots$ | $t_{1,C-k}$ |
|---|---|---|---|---|---|---|---|---|
| $x_{k+1}$ | $x_{k+2}$ | $x_{k+3}$ | $\cdots$ | $x_{2k}$ | $t_{2,1}$ | $t_{2,2}$ | $\cdots$ | $t_{2,C-k}$ |
| $x_{2k+1}$ | $x_{2k+2}$ | $x_{2k+3}$ | $\cdots$ | $x_{3k}$ | $t_{3,1}$ | $t_{3,2}$ | $\cdots$ | $t_{3,C-k}$ |
| $\cdots$ | $\cdots$ | $\cdots$ | | $\cdots$ | $\cdots$ | $\cdots$ | | $\cdots$ |
| $x_{(s-1)k+1}$ | $x_{(s-1)k+2}$ | $x_{(s-1)k+3}$ | $\cdots$ | $x_{sk}$ | $t_{s,1}$ | $t_{s,2}$ | $\cdots$ | $t_{s,C-k}$ |
| $r_{1,1}$ | $r_{1,2}$ | $r_{1,3}$ | $\cdots$ | $r_{1,k}$ | $P_{1,1}$ | $P_{1,2}$ | $\cdots$ | $P_{1,C-k}$ |
| $r_{2,1}$ | $r_{2,2}$ | $r_{2,3}$ | $\cdots$ | $r_{2,k}$ | $P_{2,1}$ | $P_{2,2}$ | $\cdots$ | $P_{2,C-k}$ |
| $r_{3,1}$ | $r_{3,2}$ | $r_{3,3}$ | $\cdots$ | $r_{3,k}$ | $P_{3,1}$ | $P_{3,2}$ | $\cdots$ | $P_{3,C-k}$ |
| $\cdots$ | $\cdots$ | $\cdots$ | | $\cdots$ | $\cdots$ | $\cdots$ | | $\cdots$ |
| $r_{L-s,1}$ | $r_{L-s,2}$ | $r_{L-s,3}$ | $\cdots$ | $r_{L-s,k}$ | $P_{L-s,1}$ | $P_{L-s,2}$ | $\cdots$ | $P_{L-s,C-k}$ |

Fig. 2A

| | | | | k | | | | C-k | | |
|---|---|---|---|---|---|---|---|---|---|---|
| $x'_1$ | $x'_2$ | $x'_3$ | ... | $x'_k$ | $t'_{1,1}$ | $t'_{1,2}$ | ... | $t'_{1,C-k}$ | | |
| $x'_{k+1}$ | $x'_{k+2}$ | $x'_{k+3}$ | ... | $x'_{2k}$ | $t'_{2,1}$ | $t'_{2,2}$ | ... | $t'_{2,C-k}$ | | |
| $x'_{2k+1}$ | $x'_{2k+2}$ | $x'_{2k+3}$ | ... | $x'_{3k}$ | $t'_{3,1}$ | $t'_{3,2}$ | ... | $t'_{3,C-k}$ | | |
| ... | ... | ... | | ... | ... | ... | | ... | | |
| $x'_{(s-1)k+1}$ | $x'_{(s-1)k+2}$ | $x'_{(s-1)k+3}$ | ... | $x'_{sk}$ | $t'_{s,1}$ | $t'_{s,2}$ | ... | $t'_{s,C-k}$ | | |
| $r'_{1,1}$ | $r'_{1,2}$ | $r'_{1,3}$ | ... | $r'_{1,k}$ | $P'_{1,1}$ | $P'_{1,2}$ | ... | $P'_{1,C-k}$ | | |
| $r'_{2,1}$ | $r'_{2,2}$ | $r'_{2,3}$ | ... | $r'_{2,k}$ | $P'_{2,1}$ | $P'_{2,2}$ | ... | $P'_{2,C-k}$ | | |
| $r'_{3,1}$ | $r'_{3,2}$ | $r'_{3,3}$ | ... | $r'_{3,k}$ | $P'_{3,1}$ | $P'_{3,2}$ | ... | $P'_{3,C-k}$ | | |
| ... | ... | ... | | ... | ... | ... | | ... | | |
| $r'_{L-s,1}$ | $r'_{L-s,2}$ | $r'_{L-s,3}$ | ... | $r'_{L-s,k}$ | $P'_{L-s,1}$ | $P'_{L-s,2}$ | ... | $P'_{L-s,C-k}$ | | |

ENCODING/INTERLEAVING METHOD AND CORRESPONDING DEINTERLEAVING/ DECODING METHOD

BACKGROUND OF THE INVENTION

1. Field of the Invention

The field of the invention is that of digital transmission, in particular to mobile stations.

To be more precise, the invention concerns an encoding/ interleaving method and a deinterleaving/decoding method to be used in a TDMA (Time-Division Multiple Access) type digital transmission system, for example.

2. Description of the Prior Art

The principle of the TDMA technique is to time-share all of the transmission channel. In other words, to prevent information overlapping only one station sends at a time and when it is sending it occupies all of the transmission channel.

In all digital transmission systems the data symbols to be transmitted are protected by adding to them judiciously determined redundancy symbols. This standard technique is known as error control encoding or channel encoding. The redundancy is used at the receiving end to decode the receive symbols correctly, i.e. to correct any transmission errors.

Interleaving after encoding is used in digital transmission systems. The encoded symbols are then divided up and transmitted at separate times. At the receiver, decoding is preceded by deinterleaving which breaks up the bursts of errors and, ideally, yields isolated errors that are easier to process by means of the codes used subsequently in decoding.

In a TDMA system data is transmitted in the form of blocks of encoded symbols that are divided (i.e. interleaved) into bursts of several consecutive TDMA frames. At the receiver the bursts are first equalized and then deinterleaved in order to form received encoded blocks which are then decoded in order to retrieve the data symbols transmitted.

The quality of a burst after equalization varies after transmission over a radio channel, in particular a mobile radio channel with frequency hopping and a quasi-random distribution of interference signals. The transmission channel may be subject to various kinds of interference, in particular rapid fading and impulsive interference, which cause blocks of errors in the bursts.

The purpose of deinterleaving is to burst these blocks of errors so that the decoder does not have to process excessively long blocks of errors and therefore can operate correctly.

Nevertheless, even after deinterleaving, the blocks of errors may be divided into sub-blocks of errors that are too long for correct decoding. These sub-blocks of errors then affect an even greater number of symbols contained in the bursts.

A prior art solution to the problem of reducing the size of the sub-blocks of errors is to increase the depth of interleaving, i.e. the number of blocks used to construct a burst. However, this prior art solution has the drawback of increasing the transmission time-delay and therefore of reducing transmission quality (especially in the transmission of speech).

One object of the invention is to overcome these various drawbacks of the prior art.

To be more precise, one object of the present invention is to provide an encoding/interleaving method that, for the same encoding power, is less complex than the prior art encoding/interleaving methods.

Another object of the invention is to provide a deinterleaving/decoding method that enables correct decoding even in the presence of blocks of errors of such a size that it is not possible to correct them using the known methods.

Another object of the invention is to provide a deinterleaving/decoding method of this kind that reduces the depth of interleaving and therefore the transmission time-delay.

SUMMARY OF THE INVENTION

These various objects, and others that will emerge hereinafter, are achieved in accordance with the invention by means of a method of encoding/interleaving a source sequence of data symbols to be transmitted to produce at least two bursts to be sent over a transmission channel and made up of said data symbols to be transmitted and redundancy symbols, this method comprising the steps of:

writing said data symbols to be transmitted of said source sequence row by row into a base matrix, storing said base matrix in a first quadrant of a send extended matrix, a first encoding step using columns of said base matrix, generating first redundancy symbols which are stored in a second quadrant of said send extended matrix and constitute additional rows of said base matrix, a second encoding step using rows of said base matrix, generating second redundancy symbols which are stored in a third quadrant of said send extended matrix and constitute additional columns of said base matrix, reading said send extended matrix row by row (or column by column), each row (or column) of said send extended matrix constituting a burst to be sent.

Thus the encoding/interleaving method of the invention consists in replacing a single code by a combination of two codes having an equivalent encoding power but offering the advantage of being much less complex.

Said first encoding and said second encoding advantageously each use a different block code.

In a preferred embodiment of the invention, said encoding/interleaving method further comprises a third encoding step of encoding at least some of said first and/or second redundancy symbols, said third encoding step generating third redundancy symbols that are stored in a fourth quadrant of the send extended matrix. This protects the redundancy rows and/or columns.

Said third encoding step is preferably selected from:

encoding by a code identical to the code used for said first encoding step and on the columns of at least some of the second redundancy symbols;

encoding by a code identical to the code used for said second encoding step and on the rows of at least some of the first redundancy symbols;

encoding using a code different from the codes used for said first encoding step and said second encoding step and on rows of at least some of the second redundancy symbols;

encoding using a code different from the codes used for said first encoding step and said second encoding step and on rows of at least some of the first redundancy symbols.

In one embodiment, a fourth quadrant of the send extended matrix is selected from:

an empty fourth quadrant, and a fourth quadrant filled with predetermined fixed values.

The invention also concerns a method of deinterleaving/decoding a received sequence made up of at least two bursts of received symbols to obtain a received sequence of transmitted data symbols, said bursts of received symbols being obtained by an encoding/interleaving method as defined above, and said deinterleaving/decoding method comprises the following steps:

- constructing a receive extended matrix by storing the symbols of the same received burst in the same row (or the same column) of said receive extended matrix,
- a first decoding step corresponding to said first encoding step using columns of the first and second quadrants and of said receive extended matrix,
- a second decoding step corresponding to said second encoding step using rows of the first and third quadrants and of said receive extended matrix,
- reading the first quadrant of said receive extended matrix row by row or column by column to form said received sequence, the chronological order of said first decoding step and said second decoding step depending on information as to the quality of said transmission channel.

In this way, by a dynamic choice of the chronological order in which the first and second decoding steps are carried out it is possible to start with a decoding step that corrects some of the blocks of errors that the other one could not have corrected on its own. This other decoding step, when it is carried out subsequently, then "sees" smaller blocks of errors that it is able to process.

Note that if, during the reading step of the encoding/interleaving method, the symbols of the same row are written into the same burst, during the step of constructing a matrix of the deinterleaving/decoding method the symbols of the same burst are necessarily stored in the same row. The same applies to a column instead of a row.

If the decoding step carried out chronologically the first is carried out on a structural element (row or column) of the matrix of the same type as that in which the symbols of the same burst are stored during the step of constructing a matrix of the deinterleaving/decoding method, this means that the decoding step carried out first is equivalent to decoding of symbols that have not been either interleaved or deinterleaved. The decoding step carried out second is then equivalent to decoding symbols that have been interleaved but not yet deinterleaved. This first case is therefore chosen if the quality of the channel on transmission of a burst is such that there are only small blocks of errors and it is therefore preferable to start by decoding together the symbols of the burst transmitted (which symbols are on the same row, for example), and then to decode together the symbols of several successive bursts (symbols which are in the same column, for example) and comprising smaller blocks of errors as a result of the first correction (carried out on the rows).

In the second case, i.e. if the decoding step carried out chronologically first is on a structural element (row or column) of the matrix of a type different than that in which the symbols of the same burst are stored during the step of constructing a matrix of the interleaving/decoding method, the decoding step carried out first is equivalent to decoding symbols that have been interleaved but not yet deinterleaved, the decoding step carried out second being equivalent to decoding symbols that have not been either interleaved or deinterleaved. The second case is therefore chosen if the quality of the channel on transmission of a burst is such that there are larger blocks of errors and it is therefore preferable to start by decoding together symbols of several successive bursts (symbols which are in the same column, for example) and then to decode together the symbols of a single transmitted burst (which symbols are in the same row, for example) and comprising blocks of errors of reduced size compared to the large blocks of errors that originally existed as a result of the first correction (carried out on columns).

It is important to realize that the invention is very different from conventional encoding/interleaving-deinterleaving/decoding techniques. In these conventional techniques the various phases are successive. Thus, at the transmitter, the source sequence of data symbols is encoded and the encoded sequence is interleaved to form bursts. At the receiver, the bursts received are deinterleaved to form a received encoded sequence and this received encoded sequence is decoded to yield the received sequence of data symbols.

In accordance with the invention, on the other hand, the encoding and the interleaving at the transmitter are intermingled and the deinterleaving and the decoding at the receiver are also intermingled.

At the transmitter, interleaving is effected in part (i.e. the steps of writing into the basic matrix and of storing the basic matrix in the send extended matrix) before encoding (the first and second encoding steps) and in part after encoding (i.e. the step of reading the send extended matrix to construct the bursts).

Likewise, at the receiver, deinterleaving is effected in part (i.e. the construction of the receive extended matrix) before the decoding (the first and second decoding steps) and in part after the decoding (i.e. the steps of reading the receive extended matrix to construct the received sequence).

This intermingling enables either symbols that have undergone "virtual" interleaving/deinterleaving or symbols transmitted as such to be processed first.

Said deinterleaving/decoding method preferably further comprises a third decoding step corresponding to said third encoding step and carried out before the (first or second) decoding step corresponding to the (first or second) encoding step that produces the (first or second) redundancy symbols on which said third encoding step was effected.

In this way, the third decoding step corrects errors in the redundancy symbols, the redundancy symbols corrected in this way being thereafter used to correct errors in the symbols of the first quadrant of the receive extended matrix.

In a first embodiment, the deinterleaving/decoding method comprises the following steps:

- constructing a receive extended matrix by storing the symbols of the same received burst in the same row (or the same column) of said receive extended matrix,
- a first decoding step (on columns) corresponding to said first encoding step to detect errors in each column of the first and second quadrants of the receive extended matrix,
- a second decoding step (on rows) corresponding to said second encoding to detect errors in each row of the first and third quadrants and of the receive extended matrix,
- classifying the rows and columns of the receive extended matrix in order of increasing number of errors associated with said rows and columns,
- a first decoding step if the first element is a column or a second decoding step if the first element is a row to correct errors in the first element of said classification, said classification and error correction steps being repeated with the uncorrected rows and columns until all of the rows and columns have been corrected, reading the first quadrant of the receive extended matrix row by row (or column by column) to form said received sequence.

Accordingly, the capacity of the codes to detect errors is used first and the capacity of the codes to correct the errors detected is used second. The classification for each iteration is modified if the corrections previously effected on a row or a column have reduce the number of errors in a row or a column having elements in common with the corrected row or column.

The codes used for the various encoding steps are predetermined. This predetermined choice depends, for example, on the average characteristics of the channel and of the transmission system in which the method of the invention is implemented.

In an advantageous variant, the codes used for the various encoding steps are chosen dynamically according to said information as to the quality of said transmission channel.

In a preferred embodiment of the invention, the method is of the type comprising, at the transmitter, a step of associating a predetermined learning sequence with each burst of symbols to be sent and, at the receiver, for each burst of symbols received, a step of estimating the impulse response of the transmission channel from a learning sequence extracted from said received burst, and a step of equalizing the symbols of said received burst as a function of an estimate of the impulse response of the transmission channel, said equalization step delivering for each symbol received an estimated symbol and a confidence indicator associated with said estimated symbol, said information as to the quality of said transmission channel being selected from:

information obtained from said estimate of the impulse response of the transmission channel;

information obtained from an error rate of said learning sequence extracted from a received burst; and information obtained from confidence indicators associated with estimated symbols of a received burst.

Finally, in a third variant, said bursts of received symbols are obtained by means of an encoding/interleaving method comprising the following steps:

writing said data symbols to be transmitted of said source sequence row by row (or column by column) into a base matrix, storing said base matrix in a first quadrant of a send extended matrix, a first encoding step on columns of said base matrix, generating first redundancy symbols which are stored in a second quadrant of said send extended matrix and constitute additional rows of said base matrix, a second encoding step on rows of said base matrix, generating second redundancy symbols which are stored in a third quadrant of said send extended matrix and constitute additional columns of said base matrix, reading said send extended matrix row by row or column by column, according to information as to the quality of said transmission channel, each row or column of said send extended matrix read constituting a burst to be sent.

and said deinterleaving/decoding method comprises the following steps:

constructing a receive extended matrix by storing the symbols of the same received burst in the same row or the same column of said receive extended matrix, the choice being the same as for said writing step of the encoding/interleaving phase, a first decoding step corresponding to said first encoding step on columns of the first and second quadrants of said receive extended matrix, a second decoding step corresponding to said second encoding step on the rows of the first and third quadrants of said receive extended matrix, reading the first quadrant of said receive extended matrix row by row or column by column the choice being the same as for said reading step of the encoding/interleaving phase, to form said received sequence, the chronological order of carrying out said first and second decoding steps being fixed.

Thus, in this variant, the decoding order at the receiver is always the same. At the transmitter, on the other hand, a burst is either a row or a column of the send extended matrix. In this way the choice is made at the transmitter (and not at the receiver, as previously). In terms of the results, this variant is equivalent to the previous embodiment. A variable type of burst (a burst is either a row or a column) with a fixed decoding order is equivalent to a fixed type of burst with a variable decoding order (starting either by decoding rows or by decoding columns).

Other features and advantages of the invention will emerge from a reading of the following description of several preferred embodiments of the invention given by way of non-limiting illustrative example only and from the appended drawings.

BRIEF DESCRIPTION OF THE DRAWINGS

The upper part of FIG. 1 is a flowchart of a preferred embodiment of an encoding/interleaving method of the invention and the lower part is a flowchart of a preferred embodiment of a deinterleaving/decoding method of the invention.

DETAILED DESCRIPTION OF THE PREFERRED EMBODIMENT

Thus the invention concerns an encoding/interleaving method and a deinterleaving/decoding method.

Figure 1:
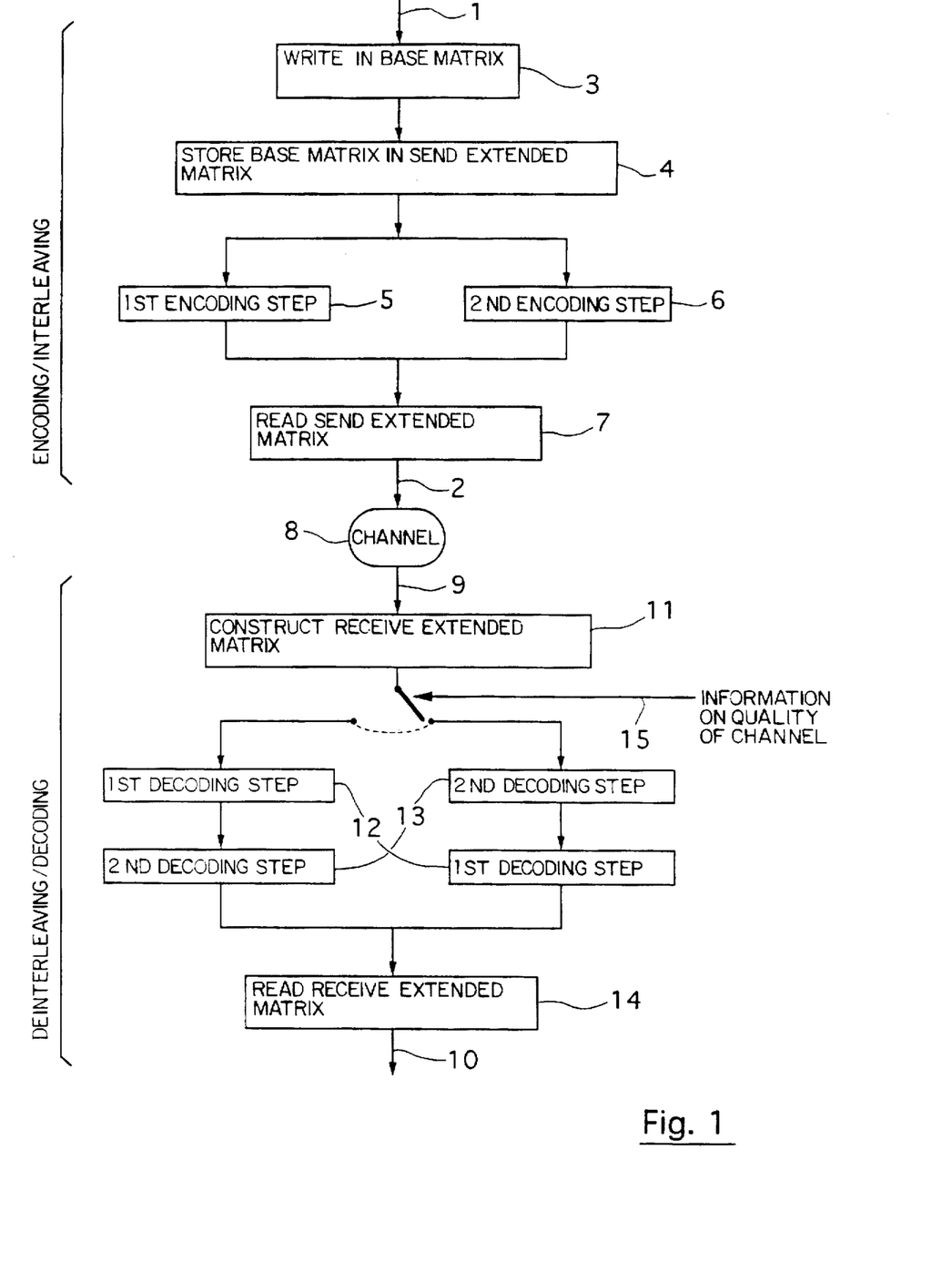

The upper part of FIG. 1 is a flowchart of a preferred embodiment of an encoding/interleaving method of the invention. This method produces from a source sequence 1 of data symbols to be transmitted bursts 2 to be sent made up of data symbols to be transmitted and redundancy symbols.

Figure 2A:
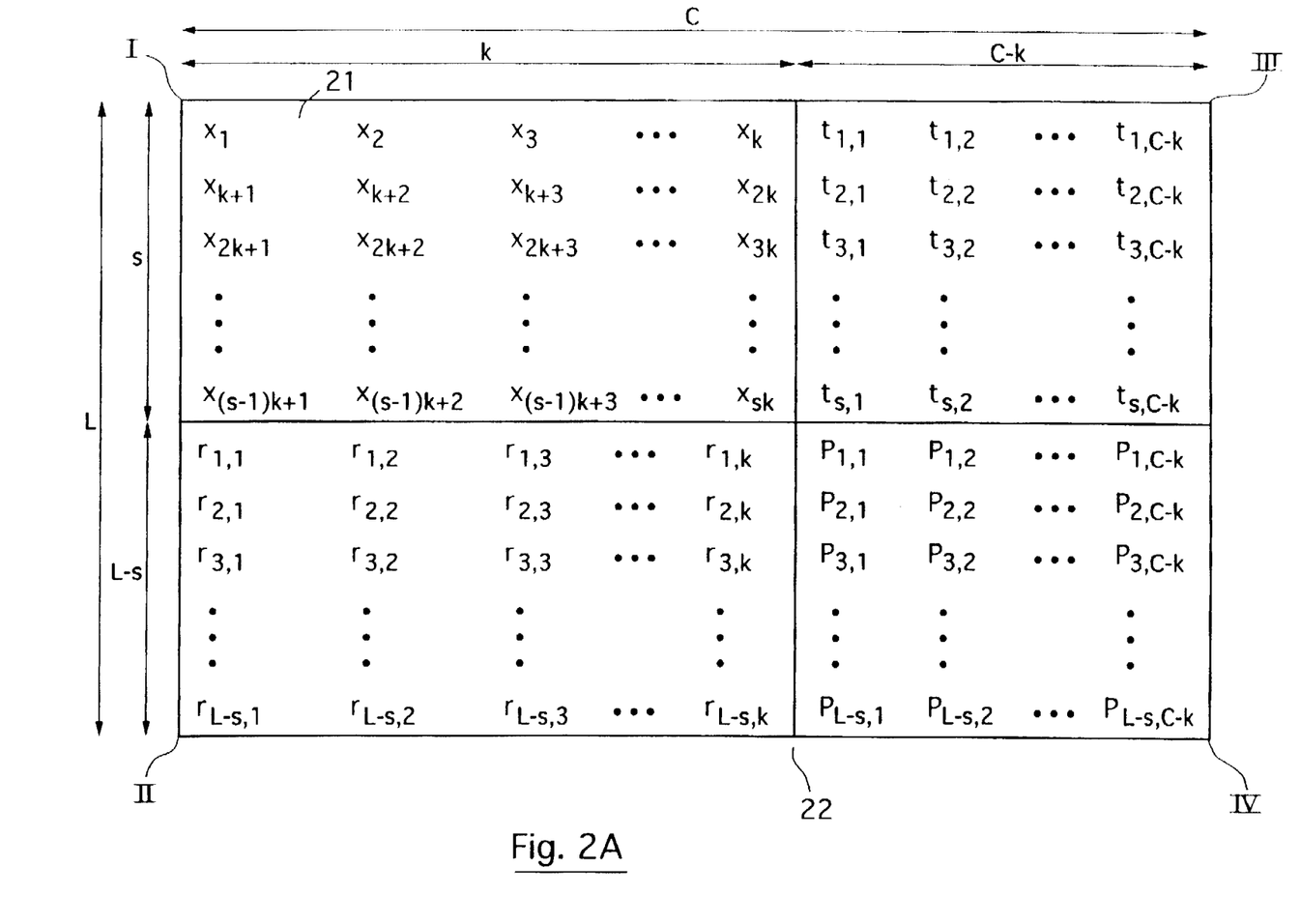
FIGS. 2A and 2B respectively show an example of a send extended matrix and an example of a receive extended matrix produced on carrying out the method shown in the upper part and in the lower part, respectively, of FIG. 1.

The various steps of this encoding/interleaving method, now described with reference to FIGS. 1 and 2A (FIG. 2A showing one example of a send extended matrix created on executing the aforementioned method) are as follows:

3: writing the data symbols to be transmitted $x_1$ through $x_{sk}$ of the source sequence 1 row by row into a base matrix 21 with s rows and k columns (with s>1 and k>1);

4: storage of the base matrix 21 in a first quadrant I of a send extended matrix 22 with L rows and C columns;

5: a first encoding step on columns of the base matrix 21, generating first redundancy symbols $r_{i,j}$ with $i \in [1, L-s]$, and $j \in [1, k]$ which are stored in a second quadrant II of the send extended matrix 22 and constitute additional rows of the base matrix 21;

6: a second encoding step on rows of the base matrix 21, generating second redundancy symbols $t_{i,j}$ with $i \in [1, s]$, and $j \in [1, C-k]$ which are stored in a third quadrant III of the send extended matrix 22 and constitute additional columns of the base matrix 21;

7: reading the send extended matrix 22 row by row, each row of the send extended matrix 22 constituting a burst 2 to be sent over a transmission channel 8.

It is clear that the invention also concerns the case in which the write step 3 and the read step 7 are carried out column by column, each column of the send extended matrix then constituting a burst 2 to send.

The production of the first redundancy symbols can be represented by the following equations in which $C_1$ and $C_2$ denotes the first and second encoding steps:

$$(r_{1,1}, r_{2,1}, \ldots, r_{L-s, 1}) = C_1(x_1, x_{k+1}, \ldots, x_{(s-1)k+1})$$

$$(r_{1, k}, r_{2, k}, \ldots, r_{L-s, k}) = C_1(x_k, x_{2k}, \ldots, x_{sk})$$

and that of the second redundancy symbols by the equations:

$$(t_{1,1}, t_{1,2}, \ldots, t_{1, C-k}) = C_2(x_1, x_2, \ldots, x_k)$$

$$(t_{s, 1}, t_{s,2}, \ldots, t_{s, C-k}) = C_2(x_{(s-1)k+1}, x_{(s-1)k+2}, \ldots, x_{sk})$$

The lower part of FIG. 1 is a flowchart of a preferred embodiment of a deinterleaving/decoding method of the invention.

At the receiver, the deinterleaving/decoding phase produces from the received bursts of symbols 9 a received sequence 10 of transmitted data symbols. The received symbols 9 are produced at the transmitter by the encoding/interleaving method explained above with reference to the upper part of FIG. 1. The objective is to obtain a received sequence 10 identical to the source sequence 1.

Figure 2B:
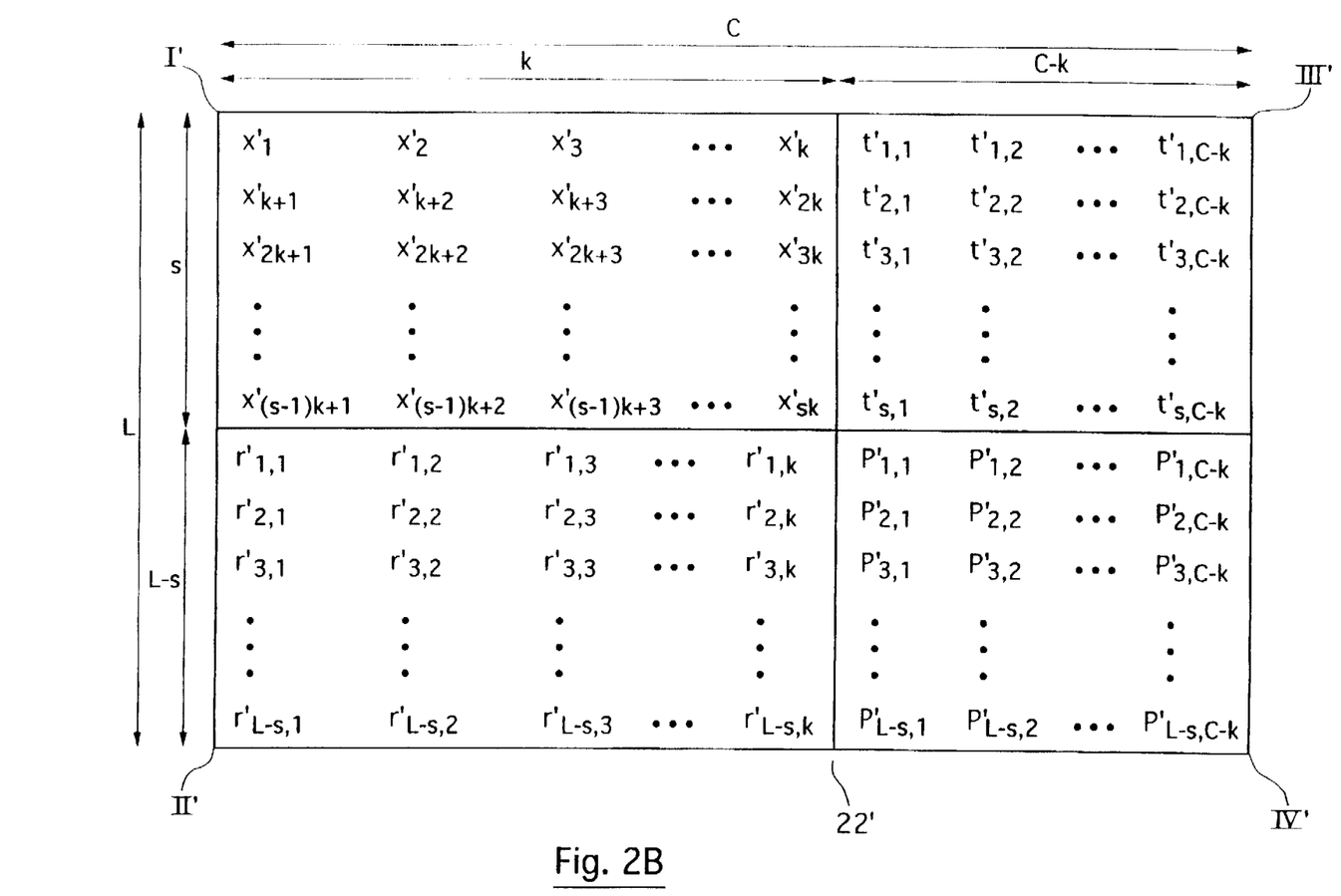

This deinterleaving/decoding method comprises the following steps (see also FIG. 2B which shows one example of a receive extended matrix):

11: construction of a receive extended matrix 22' with L rows and C columns by storing the symbols of the same received burst 9 in the same row or the same column of the receive extended matrix 22', according to whether the write step 3 and read step 7 were carried out row by row or column by column; in this way an extended matrix 22' is reproduced at the receiver which is identical to that produced at the transmitter except for erroneous symbols due to transmission over the channel 8;

12: a first decoding step corresponding to the first encoding step 5 on columns of the first and second quadrants I' and II' of the receive extended matrix 22'; this first decoding step corrects errors in the symbols of the first quadrant I', $x'_1$ through $x'_{sk}$, using the redundancy elements in the second quadrant II', $r'_{i,j}$ with $i \in [1, L-s]$ and $j \in [1, k]$;

13: a second decoding step corresponding to the second encoding step 6 on rows of the first and third quadrants I' and III' of the receive extended matrix 22'; this second decoding step corrects errors in the symbols of the first quadrant I', $x'_1$ through $x'_{sk}$, using the redundancy elements in the third quadrant III', $t'_{i,j}$ with $i \in [1, s]$ and $j \in [1, C-k]$;

14: reading the first quadrant I' of the receive extended matrix 22' row by row or column by column, depending on whether the write step 3 and the read step 7 were carried out row by row or column by column, to form the receive sequence 10 of transmitted data symbols $x'_1$ through $x'_{sk}$.

The principle of the invention is to choose the chronological order of executing the first decoding step 12 and the second decoding step 13 on the basis of information 15 as to the quality of the transmission channel 8. Various examples of calculating the information 15 are given below with reference to FIG. 7.

If the information 15 indicates that the quality of the transmission channel is very poor, it may be assumed that the bursts will contain long blocks of errors. Accordingly, the choice is made to commence the decoding step (first or second) which does not use elements (rows or columns) containing symbols from the same burst.

For example, if a burst corresponds to a row of the receive extended matrix and if the quality of the transmission channel is very poor, the choice is made to start with the second decoding step (columns). The blocks of errors in the columns are assumed to be shorter than the blocks of errors in the rows since a column comprises symbols from different bursts.

Any type of code may be used for the encoding/decoding. Block codes may be used, for example. It is nevertheless clear than convolutive codes can be used. However, with the latter, in order to form words that can be stored in rows or in columns it is necessary to add to the end of the group of data symbols a certain number of known symbols (as many as the code memory) so that the encoding can terminate at a known state of the trellis. This therefore increases the redundancy to be added compared to a block code which does not require any such addition.

Moreover, the codes used for the encoding steps 12, 13 can be:
  either predetermined,
  or chosen dynamically on the basis of the information 15 as to the quality of the transmission channel.

Figure 3:
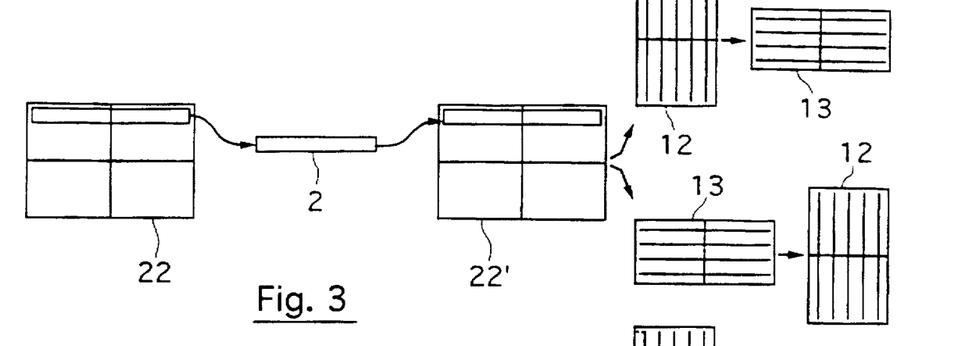
FIGS. 3 and 4 show respective different operating schemes corresponding to the preferred embodiment of the methods of the invention shown in FIG. 1.

FIG. 3 shows a first operating scheme of the method shown in FIG. 1 in the case in which a burst 2 corresponds to a row of the send extended matrix 22 and to a row of the receive extended matrix 22'.

Figure 4:
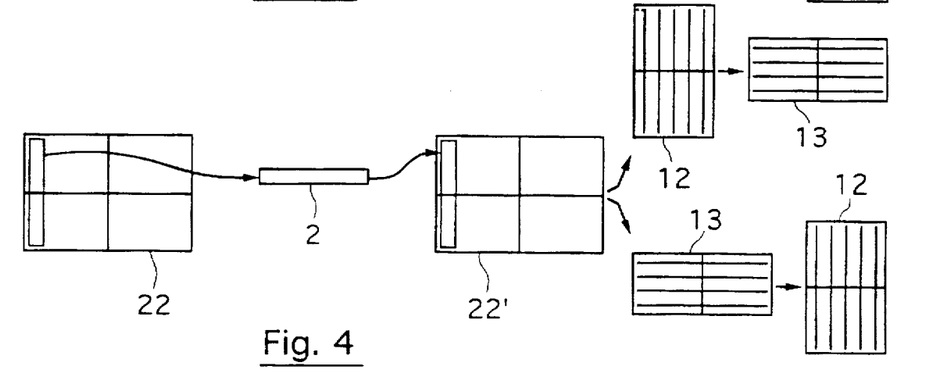

FIG. 4 shows a second operating scheme of the method shown in FIG. 1 in the case in which a burst 2 corresponds to a column of the send extended matrix 22 and to a column of the receive extended matrix 22'.

In both cases (FIGS. 3 and 4), the method entails making the following choice: either the first decoding step 12 precedes the second decoding step 13, or vice versa.

The fourth quadrant IV of the send extended matrix 22 can be empty or filled with predetermined fixed values. However, it is also possible to use the fourth quadrant IV. Accordingly, in other embodiments described next with reference to FIGS. 5 and 6 (and FIGS. 2A, 2B), the encoding/interleaving phase comprises an additional step 51, 61 of encoding some of the first and/or second redundancy symbols $r_{i,j}$ and $t_{i,j}$. This third encoding step 51, 61 generates third redundancy symbols $p_{i,j}$ with $i \in [1, L-s]$ and $j \in [1, C-k]$ which are stored in a fourth quadrant IV of the send extended matrix 22.

Various types of code can be used for the third encoding step, including:

case 1: encoding by a code identical to the code $C_1$ used for the first encoding step 12 on columns of the second redundancy symbols $t_{i,j}$, in which case:

$$(p_{1,1}, p_{2,1}, \ldots, P_{L-s,1}) = C_1(t_{1,1}, t_{2,1}, \ldots, t_{s,1})$$

$$(p_{1,c-k}, p_{2,c-k}, \ldots, P_{L-s,c-k}) = C_1(t_{1,c-k}, t_{2,c-k}, t_{2,c-k}, \ldots, t_{s,c-k})$$

case 2: encoding by a code identical to the code $C_2$ used for the second encoding step 13 on rows of the first redundancy symbols $r_{i,j}$, in which case:

$$\text{ti } (p_{1,1}, p_{1,2}, \ldots, P_{1,c-k}) = C_2(r_{1,1}, r_{1,2}, \ldots, r_{1,k})$$

$$(P_{L-s,1}, P_{L-s,2}, \ldots, P_{L-s,c-k}) = C_2(r_{L-s,1}, r_{L-s,2}, \ldots, r_{L-s,k})$$

case 3: encoding using a code $C_3$ different from the codes $C_1$ and $C_2$ used for the first encoding step 12 and the second encoding step 13 on rows of the first redundancy symbols $t_{i,j}$, in which case:

$$p_{1,1}, p_{2,1}, \ldots, P_{L-s,1} = C_3(t_{1,1}, t_{2,1}, \ldots, t_{s,1})$$

$$(p_{1,c-k}, p_{2,c-k}, \ldots, P_{L-s,c-k}) = C_3(t_{1,c-k}, t_{2,c-k}, t_{2,c-k}, \ldots, t_{s,c-k})$$

case 4: encoding using a code $C_3$ different from the codes $C_1$ and $C_2$ used for the first encoding step 12 and the second encoding step 13 on rows of the first redundancy symbol $r_{i,j}$, in which case:

$$(p_{1,1}, p_{1,2}, \ldots, p_{1,c-k}) = C_3(r_{1,1}, r_{1,2}, \ldots, r_{1,k})$$

$$p_{L-s,1}, p_{L-s,2}, \ldots, P_{L-s,c-k} = C_3(r_{L-s,1}, r_{L-s,2}, \ldots, r_{L-s,k})$$

Figure 5:
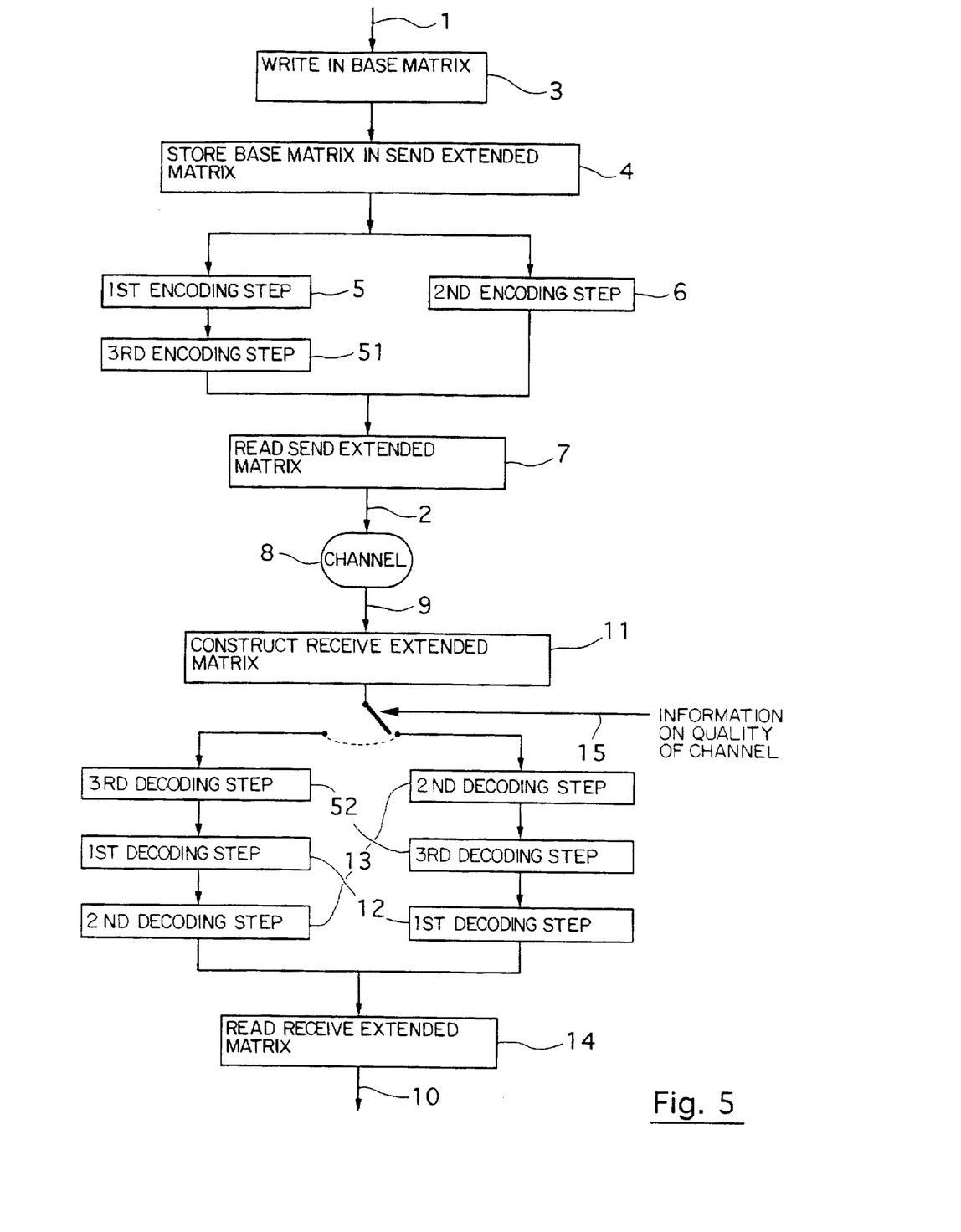
FIGS. 5 and 6 are respectively flowcharts of second and third preferred embodiments of a deinterleaving/decoding method of the invention.

FIG. 5 corresponds to cases 2 and 4: the third encoding step 51 is carried out on the redundancy elements $r_{i,j}$ generated in the first encoding step 5.

Figure 6:
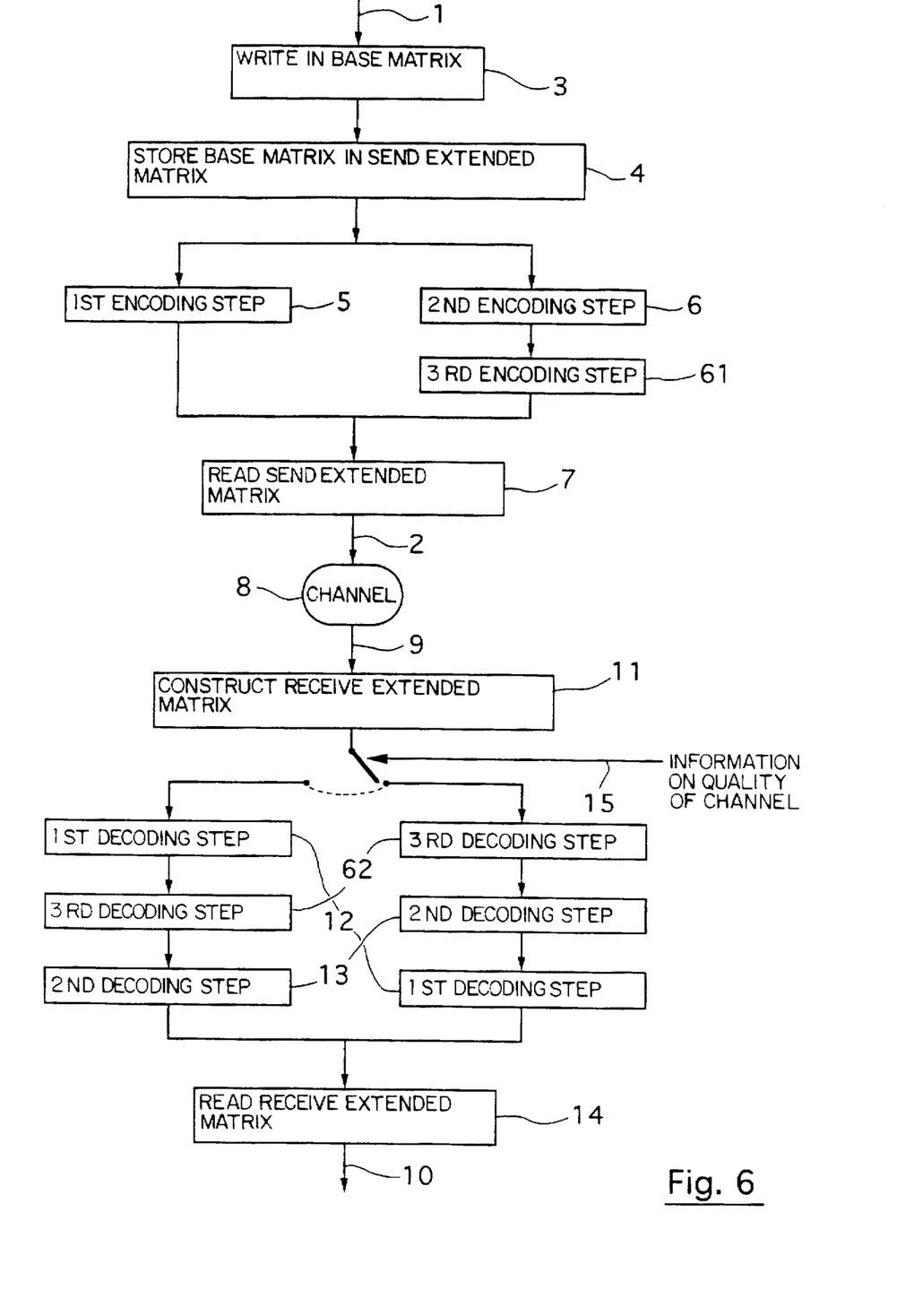

FIG. 6 corresponds to cases 1 and 3: the third encoding step 61 is carried out on the redundancy elements $t_{i,j}$ generated by the second encoding step 6.

In these other embodiments shown in FIG. 5 and 6, the deinterleaving/decoding method comprises an additional step in the form of a third decoding step 52, 62 to correct the received redundancy symbols corresponding to those on which the third encoding step 51, 61 was effected.

This third decoding step 52, 62 is carried out before the decoding corresponding to the encoding that produced the redundancy symbols on which the third encoding step 51, 61 was effected.

Thus, in the case of FIG. 5, the third encoding step 51 being effected on redundancy elements $r_{i,j}$ generated in the first encoding step 5, the third encoding step 52 is carried out before the first decoding step 12 (which corresponds to the first encoding step 5).

On the other hand, in the case of FIG. 6, the third encoding step 61 being effected on redundancy elements $t_{i,j}$ generated in the second encoding step 6, the third decoding step 62 is carried out before the second decoding step 13 (which corresponds to the second encoding step 6).

Figure 7:
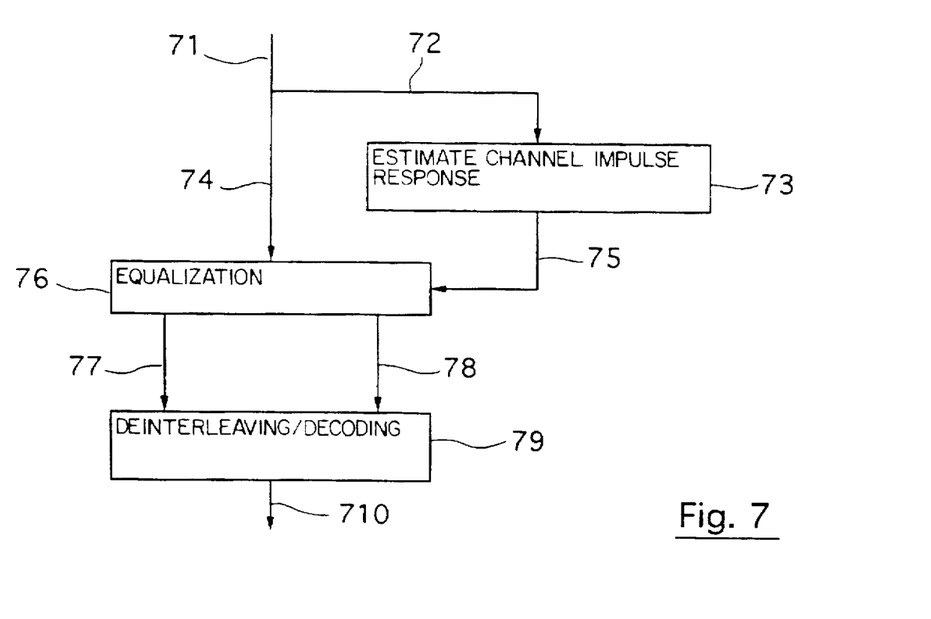
FIG. 7 is a diagram explaining reception in a digital transmission system using a method of the invention.

FIG. 7 is a flowchart explaining reception in a digital transmission system using the methods of the invention.

In a system of this kind, at the transmitter, each burst of symbols to be sent includes additional start and end symbols and a predetermined learning sequence. This sequence is used at the receiver for synchronization, channel estimation and equalization. It is generally placed in the middle of the burst in order to minimize the fluctuations of the channel that the equalizer will have to process along the burst.

At the receiver, for each received burst of symbols 71, a learning sequence 72 is extracted and is used to estimate (73) the impulse response of the transmission channel. The wanted symbols 74 of the received burst 71 are then equalized (76) in accordance with an estimate (75) of the impulse response of the channel obtained beforehand.

The role of this equalization step 76 is to reduce intersymbol interference affecting the received symbols. For each received symbol it delivers an estimated symbol 77 (or decision) and a confidence indicator 78 associated with the estimated symbol 77.

The deinterleaving/decoding method 79 is applied to bursts of estimated symbols 77 and produces a received sequence 710 of transmitted data symbols.

Various techniques for calculating the information as to the quality of the transmission channel are feasible, given the data available at the receiver.

A first technique uses the estimate 75 of the impulse response of the channel. This estimate 75 is in the form of a set of coefficients. The sum of the squares of the coefficients may be calculated, for example. The higher the result, the better is the estimate 75. As a result equalization is more effective and the bursts received and equalized are of better quality.

A second technique uses the learning sequence after equalization. At the receiver, the learning sequence is known and the error rate in the learning sequence after equalization can be calculated by comparison. The lower the result the better the quality of the channel and therefore of the received and equalized bursts.

A third technique uses the confidence indicator 78 associated with the estimated symbols 77 of the received bursts. If the possible symbols are 0 and 1, for example, the confidence indicators 77 can be integer values between −7 and +7. −7 denotes a certain 0 and +7 denotes a certain 1. 0 indicates a "deletion", i.e. a symbol for which the equalizer prefers to not to take a decision. The mean of the absolute values of the confidence indicators 77 may be calculated, for example. The closer this mean value to 7, the better the quality of the channel and therefore of the bursts received and equalized.

Note that this third technique can be applied equally well to the rows as to the columns of the receive extended matrix. It provides a good comparison of the quality of the rows and the columns so that it is possible to decide correctly which decoding (rows or columns) to start with.

Figure 10:
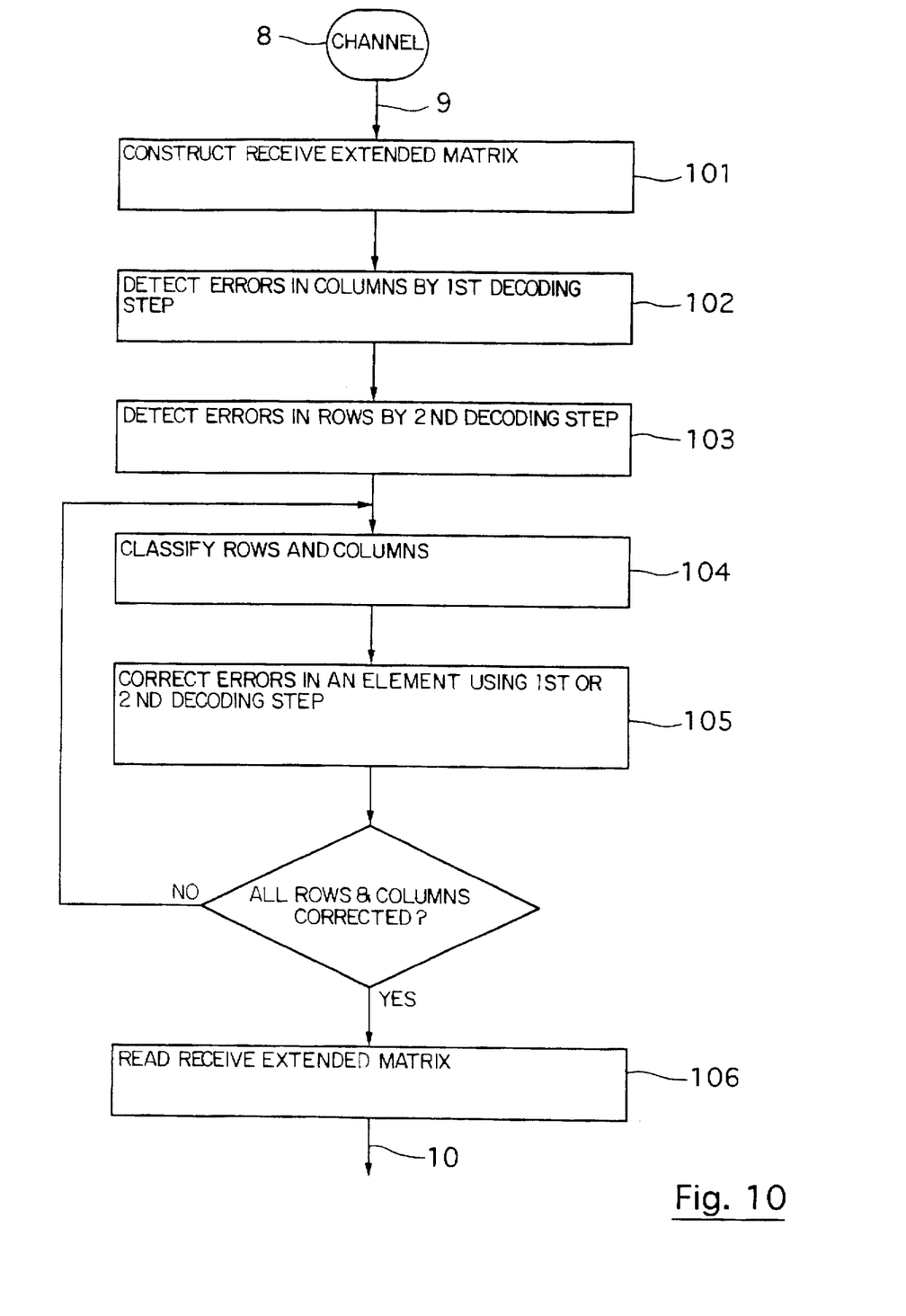
FIG. 10 is a flowchart of another variant of the preferred embodiment of the deinterleaving/decoding method of the invention shown in the lower part of FIG. 1.

FIG. 10 is a flowchart of a variant of the preferred embodiment of the deinterleaving/decoding method of the invention shown in the lower part of FIG. 1. In this variant, the deinterleaving/decoding method comprises the following steps:

101: constructing a receive extended matrix 22' by storing the symbols of the same received burst 9 in the same row (or the same column) of the receive extended matrix.

102: a first decoding step on columns corresponding to the first encoding step to detect errors in each column of the first and second quadrants I', II' of the receive extended matrix 22'.

103: a second decoding step on rows corresponding to said second encoding step to detect errors in each row of the first and third quadrants I' and III' of the receive extended matrix 22'.

104: classification of the rows and columns of the receive extended matrix 22' in order of increasing number of errors associated with the rows and columns, 105: a first decoding step if the first element is a column or a second decoding step if the first element is a row to correct errors in the first element of said classification (i.e. the element containing the fewest errors), the classification step 104 and the error correction step 105 being repeated with the uncorrected rows and columns until all of the rows and columns have been corrected.

106: reading the first quadrant I' of the receive extended matrix 22' row by row (or column by column) to form the received sequence 10.

This variant is very flexible since the code words (row or column) are decoded according to their estimated quality (based on the number of errors detected), starting with the words containing the fewest errors.

Figure 8:
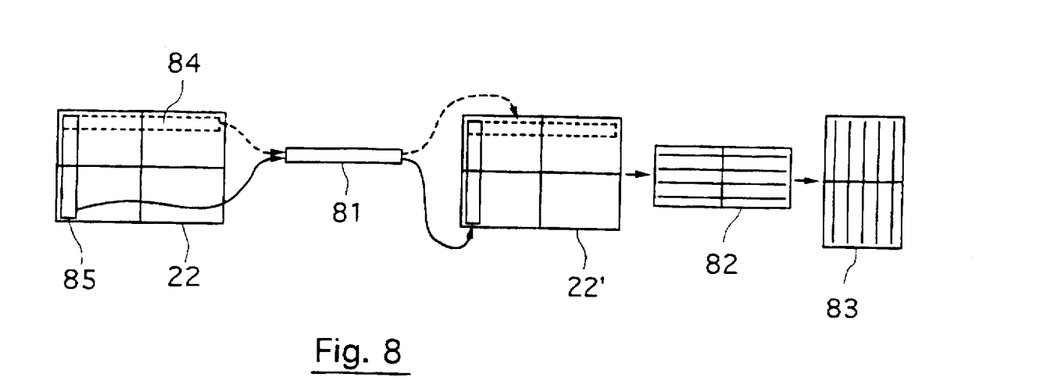
FIGS. 8 and 9 show respective schemes of operation corresponding to a variant of the preferred embodiment of the methods of the invention shown in FIG. 1.
Figure 9:
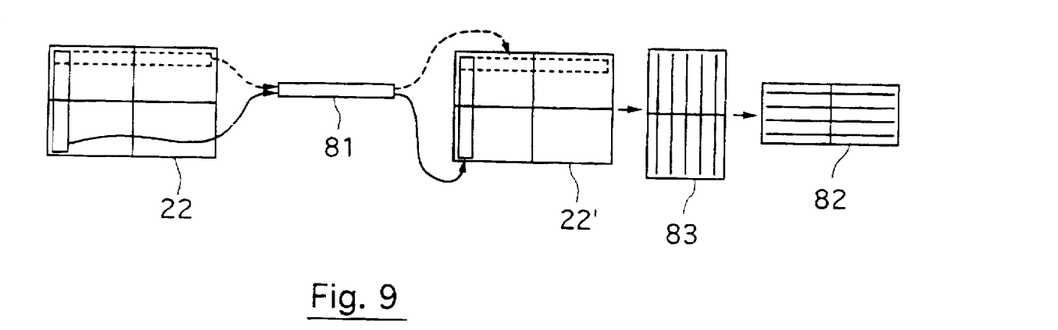

FIGS. 8 and 9 each show a different operating scheme corresponding to a further variant of the embodiment of the methods of the invention shown in FIG. 1.

In this variant a choice is made at the transmitter (and not at the receiver), the chronological order of the first and second decoding steps at the receiver being fixed. At the transmitter, the choice is whether a burst comprises a row or a column of the send extended matrix, on the basis of information as to the quality of the transmission channel.

In the deinterleaving/decoding phase the choice made at the transmitter (row or column) is retained. The choice can be transmitted in a specific field of the burst itself, for example.

FIG. 8 shows an operating scheme in the case where row decoding (82) is always carried out before column decoding (83). A burst 81 to send is either a row 84 (shown in dashed outline) or a column 85 of the send extended matrix 22. The same choice is retained for constructing the receive extended matrix. Row decoding (82) is then carried out before column decoding. Accordingly, if the initial choice is to place a row in each burst, but the overall decoding quality (i.e. for both the row and column decoding) is poor, the choice made at the transmitter is reversed and a column is placed in each burst.

FIG. 9 simply shows the case in which column decoding (83) is always carried out before row decoding (82).

I claim:

1. A method of encoding/interleaving a source sequence of data symbols to be transmitted to produce at least two bursts to be sent over a transmission channel and made up of said data symbols to be transmitted and redundancy symbols, which method comprises the steps of:

writing data symbols to be transmitted of said source sequence row by row into a base matrix, storing said base matrix in a first quadrant of a send extended matrix, in a first encoding step on columns of said base matrix, generating first redundancy symbols which are stored in a second quadrant of said send extended matrix and constitute additional rows of said base matrix, in a second encoding step on rows of said base matrix, generating second redundancy symbols which are stored in a third quadrant of said send extended matrix and constitute additional columns of said base matrix, reading said send extended matrix row by row (or column by column), each row or column of said send extended matrix constituting a burst to be sent.

2. A method according to claim 1, wherein said first encoding step and said second encoding step each use a different block code.

3. A method according to claim 1, further comprising a third encoding step of encoding at least some of said first and/or second redundancy symbols, said third encoding step generating third redundancy symbols that are stored in a fourth quadrant of said send extended matrix.

4. A method according to claim 3, wherein said third encoding step is selected from:

encoding by a code identical to the code used for said first encoding step and on the columns of at least some of said second redundancy symbols;

encoding by a code identical to the code used for said second encoding step and on the rows of at least some of said first redundancy symbols;

encoding using a code different from the codes used for said first encoding step and said second encoding step and on rows of at least some of said second redundancy symbols';

encoding using a code different from the codes used for said first encoding step and said second encoding step and on rows of at least some of said first redundancy symbols.

5. A method according to claim 1, wherein a fourth quadrant of said send extended matrix is selected from:

an empty fourth quadrant, and a fourth quadrant filled with predetermined fixed values.

6. A method of deinterleaving/decoding a received sequence made up of at least two bursts of received symbols to obtain a received sequence of transmitted data symbols, wherein said bursts of received symbols are obtained by an encoding/interleaving method as claimed in claim 1, and said deinterleaving/decoding method comprises the following steps:

constructing a receive extended matrix by storing the symbols of the same received burst in the same row (or the same column) of said receive extended matrix, a first decoding step corresponding to said first encoding step on columns of the first and second quadrants of said receive extended matrix, a second decoding step corresponding to said second encoding step on rows of said first and third quadrants of said receive extended matrix, reading the first quadrant of said receive extended matrix row by row or column by column to form said received sequence, the chronological order of said first decoding step and said second decoding step depending on information as to the quality of said transmission channel.

7. A method according to claim 6, further comprising a third decoding step corresponding to said third encoding step and carried out before said (first or second) decoding step corresponding to said (first or second) encoding step that produces said (first or second) redundancy symbols on which said third encoding step was effected.

8. A Method of deinterleaving/decoding a received sequence comprising at least two bursts of received symbols to obtain a received sequence of transmitted data symbols, wherein said bursts of received symbols are obtained by an encoding/interleaving method as claimed in claim 1, and said deinterleaving/decoding method comprises the following steps:

constructing a receive extended matrix by storing the symbols of the same received burst in the same row (or the same column) of said receive extended matrix, a first decoding step (on columns) corresponding to said first encoding step to detect errors in each column of the first and second quadrants of said receive extended matrix, a second decoding step (on rows) corresponding to said second encoding to detect errors in each row of said first and third quadrants of said receive extended matrix, classifying said rows and columns of said receive extended matrix in order of increasing number of errors associated with said rows and columns, a first decoding step if the first element is a column or a second decoding step if the first element is a row to correct errors in said first element of said classification, said classification step and said error correction step being repeated with the uncorrected rows and columns until all of said rows and columns have been corrected, reading said first quadrant of said receive extended matrix row by row (or column by column) to form said received sequence.

9. A method according to claim 6, wherein the codes used for the various encoding steps are predetermined.

10. A method according to claim 6, wherein the codes used for the various encoding steps are chosen dynamically according to said information as to the quality of said transmission channel.

11. A method according to claim 6, of the type comprising, at the transmitter, a step of associating a predetermined learning sequence with each burst of symbols to be sent and, at the receiver, for each burst of symbols received, a step of estimating the impulse response of said transmission channel from a learning sequence extracted from said received burst, and a step of equalizing the symbols of said received burst as a function of an estimate of the impulse response of said transmission channel, said equalization step delivering for each symbol received an estimated symbol and a confidence indicator associated with said estimated symbol, wherein said information as to the quality of said transmission channel is selected from:

information obtained from said estimate of the impulse response of said transmission channel;

information obtained from an error rate of said learning sequence extracted from a received burst; and information obtained from confidence indicators associated with estimated symbols of a received burst.

12. A method of deinterleaving/decoding a received sequence made up of at least two bursts of received symbols to obtain a received sequence of transmitted data symbols, wherein said bursts of received symbols are obtained by means of an encoding/interleaving method comprising the following steps:

writing data symbols to be transmitted of said source sequence row by row into a base matrix, storing said base matrix in a first quadrant of a send extended matrix with rows and columns, a first encoding step on columns of said base matrix, generating first redundancy symbols which are stored in a second quadrant of said send extended matrix and constitute additional rows of said base matrix, a second encoding step on rows of said base matrix, generating second redundancy symbols which are stored in a third quadrant of said send extended matrix and constitute additional columns of said base matrix, reading said send extended matrix row by row (or column by column), each row (or column) of said send extended matrix constituting a burst to be sent, and wherein said deinterleaving/decoding method comprises the following steps:

constructing a receive extended matrix by storing the symbols of the same received burst in the same row (or the same column) of said receive extended matrix, a first decoding step corresponding to said first encoding step on columns of the first and second quadrants of said receive extended matrix, a second decoding step corresponding to said second encoding step on rows of the first and third quadrants of said receive extended matrix, reading the first quadrant of said receive extended matrix row by row or column by column to form said received sequence of transmitted data symbols, the chronological order of carrying out said first and second decoding steps being fixed.

* * * * *